US012654181B2

(12) United States Patent
Povolny et al.

(10) Patent No.: US 12,654,181 B2
(45) Date of Patent: Jun. 16, 2026

(54) GAS DISTRIBUTION FACEPLATE WITH OBLIQUE FLOW PATHS

(71) Applicant: Lam Research Corporation, Fremont, CA (US)

(72) Inventors: Henry Stephen Povolny, Newark, CA (US); Andrew D. Bailey, III, Milpitas, CA (US); Anthony de la Llera, Fremont, CA (US); Nebiyu Barsula Sermollo, Hayward, CA (US); Shawn Tokairin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 995 days.

(21) Appl. No.: 17/759,509

(22) PCT Filed: Jan. 28, 2021

(86) PCT No.: PCT/US2021/015430
§ 371 (c)(1),
(2) Date: Jul. 26, 2022

(87) PCT Pub. No.: WO2021/154950
PCT Pub. Date: Aug. 5, 2021

(65) Prior Publication Data
US 2023/0057217 A1 Feb. 23, 2023

Related U.S. Application Data

(60) Provisional application No. 62/967,197, filed on Jan. 29, 2020.

(51) Int. Cl.
*C23C 16/455* (2006.01)
*B05B 1/00* (2006.01)
(Continued)

(52) U.S. Cl.
CPC ............. *B05B 1/185* (2013.01); *B05B 1/005* (2013.01); *H01J 37/3244* (2013.01); *H01J 2237/334* (2013.01)

(58) Field of Classification Search
CPC ........ B05B 1/185; B05B 1/00; H01J 37/3244; H01J 2237/334
See application file for complete search history.

(56) References Cited

U.S. PATENT DOCUMENTS

| | | | |
|---|---|---|---|
| 5,643,394 A | 7/1997 | Maydan et al. | |
| 5,792,269 A | 8/1998 | Deacon et al. | |

(Continued)

FOREIGN PATENT DOCUMENTS

| | | |
|---|---|---|
| CN | 1607889 A | 4/2005 |
| CN | 101489344 A | 7/2009 |

(Continued)

OTHER PUBLICATIONS

International Preliminary Report on Patentability dated Aug. 11, 2022 in PCT Application No. PCT/US2021/015430.

(Continued)

*Primary Examiner* — Yuechuan Yu
(74) *Attorney, Agent, or Firm* — Weaver Austin Villeneuve & Sampson LLP

(57) ABSTRACT

Gas distribution faceplates are disclosed that feature clusters of gas passages extending from inlet gas ports on a first side thereof to outlet gas ports on a second side thereof. The gas passages may each have at least a portion thereof that is at an oblique angle with respect to a nominal centerline of the gas distribution faceplate, thereby allowing the inlet gas ports for a given cluster of gas passages to be tightly grouped together and the outlet gas ports for that cluster of gas passages to be more widely spaced apart. This allows for a large numbers of gas passages to be used, thereby allowing (Continued)

for a reduction of flow rate through each gas passage and an attendant decrease in gas passage erosion rate, while reducing or eliminating the effects of overlapping wear zones around each outlet gas port.

24 Claims, 10 Drawing Sheets

(51) Int. Cl.
　　*B05B 1/18*　　　(2006.01)
　　*H01J 37/32*　　　(2006.01)

(56) References Cited

U.S. PATENT DOCUMENTS

| | | | |
|---|---|---|---|
| 6,821,347 B2 | 11/2004 | Carpenter et al. | |
| 6,884,296 B2 | 4/2005 | Basceri et al. | |
| 7,196,283 B2 | 3/2007 | Buchberger, Jr. et al. | |
| 7,581,511 B2 | 9/2009 | Mardian et al. | |
| 8,926,790 B2 | 1/2015 | Tetsuka et al. | |
| 9,082,593 B2 | 7/2015 | Hayashi et al. | |
| 9,117,635 B2 | 8/2015 | Satoh et al. | |
| 9,484,190 B2 | 11/2016 | Glukhoy | |
| 9,758,869 B2 | 9/2017 | Choi et al. | |
| 10,276,353 B2 | 4/2019 | Alayavalli et al. | |
| 10,354,843 B2 | 7/2019 | Liang et al. | |
| 10,378,107 B2 | 8/2019 | Chandrasekharan et al. | |
| 10,622,189 B2 | 4/2020 | Bravo et al. | |
| 2003/0089314 A1 | 5/2003 | Matsuki et al. | |
| 2003/0166343 A1 | 9/2003 | Furuse et al. | |
| 2005/0133161 A1 | 6/2005 | Carpenter et al. | |
| 2007/0144671 A1 | 6/2007 | Ohmi et al. | |
| 2008/0078744 A1 | 4/2008 | Wang et al. | |
| 2008/0206483 A1 | 8/2008 | Paterson et al. | |
| 2009/0081878 A1 | 3/2009 | Dhindsa | |
| 2009/0286405 A1 | 11/2009 | Okesaku et al. | |
| 2010/0024727 A1 | 2/2010 | Kim et al. | |
| 2010/0101603 A1 | 4/2010 | Chebi et al. | |
| 2010/0178775 A1* | 7/2010 | Okesaku ............ | H01J 37/3255 |
| | | | 438/726 |
| 2011/0127156 A1* | 6/2011 | Foad .................... | G11B 5/8404 |
| | | | 204/192.12 |
| 2011/0162800 A1* | 7/2011 | Noorbakhsh ..... | C23C 16/45565 |
| | | | 239/289 |
| 2014/0123900 A1 | 5/2014 | Wang et al. | |
| 2014/0209023 A1 | 7/2014 | Tsuda | |
| 2015/0011093 A1 | 1/2015 | Singh et al. | |
| 2016/0273109 A1 | 9/2016 | Harada et al. | |
| 2016/0340782 A1 | 11/2016 | Chandrasekharan et al. | |
| 2017/0098556 A1 | 4/2017 | Chandrasekharan et al. | |
| 2017/0365443 A1* | 12/2017 | Carducci .......... | H01J 37/32009 |
| 2017/0372914 A1 | 12/2017 | Yamashita | |
| 2018/0096821 A1 | 4/2018 | Lubomirsky | |
| 2019/0145002 A1 | 5/2019 | Um et al. | |
| 2019/0244793 A1 | 8/2019 | Chen et al. | |
| 2020/0321193 A1 | 10/2020 | Ni et al. | |
| 2020/0381295 A1 | 12/2020 | Cui et al. | |
| 2021/0054506 A1 | 2/2021 | Chen et al. | |
| 2021/0079526 A1 | 3/2021 | Iizuka | |
| 2021/0082665 A1 | 3/2021 | Toland et al. | |
| 2021/0187521 A1 | 6/2021 | Mustafa et al. | |
| 2022/0064797 A1 | 3/2022 | Dhanakshirur et al. | |
| 2022/0178029 A1 | 6/2022 | Obata et al. | |
| 2022/0285128 A1 | 9/2022 | Ohashi | |
| 2023/0010178 A1 | 1/2023 | Hirayama | |
| 2023/0243034 A1 | 8/2023 | Mankidy et al. | |
| 2025/0043425 A1 | 2/2025 | Mankidy et al. | |

FOREIGN PATENT DOCUMENTS

| | | |
|---|---|---|
| CN | 108103479 A | 6/2018 |
| CN | 109075059 A | 12/2018 |
| CN | 209471923 U | 10/2019 |
| JP | 2005033167 A | 2/2005 |
| JP | 2007019284 A | 1/2007 |
| JP | 2007324529 A | 12/2007 |
| JP | 3149701 U | 4/2009 |
| JP | 2009239082 A | 10/2009 |
| JP | 2010067615 A | 3/2010 |
| JP | 2014070249 A | 4/2014 |
| JP | 2017135316 A | 8/2017 |
| JP | 2018082150 A | 5/2018 |
| JP | 2019523995 A | 8/2019 |
| JP | 2019161072 A | 9/2019 |
| KR | 19990009332 U | 3/1999 |
| KR | 20060100961 A | 9/2006 |
| KR | 20100135967 A | 12/2010 |
| KR | 20130141358 A | 12/2013 |
| KR | 20160137404 A | 11/2016 |
| KR | 20170006214 A | 1/2017 |
| KR | 20170127358 A | 11/2017 |
| KR | 20190002738 A | 1/2019 |
| KR | 20190056112 A | 5/2019 |
| TW | 202020216 A | 6/2020 |
| WO | WO-2019222066 A1 | 11/2019 |

OTHER PUBLICATIONS

International Search Report and Written Opinion dated May 21, 2021 in PCT Application No. PCT/US2021/015430.
U.S. Appl. No. 18/001,697, inventors Mankidy et al., filed Dec. 12, 2022.
International Preliminary Report on Patentability dated Dec. 29, 2022, in PCT Application No. PCT/US2021/037247.
International Search Report and Written Opinion dated Oct. 5, 2021, in PCT Application No. PCT/US2021/037247.
JP Office Action dated Oct. 29, 2024 in JP Application No. 2022-545970 with English translation.
TW Office Action dated Nov. 7, 2024 in TW Application No. 110103399, with English Translation.
U.S. Non-Final Office Action dated Mar. 14, 2024 in U.S. Appl. No. 18/001,697.
U.S. Notice of Allowance dated Jul. 10, 2024 in U.S. Appl. No. 18/001,697.
U.S. Appl. No. 18/924,479, inventors Mankidy P, et al., filed Oct. 23, 2024.
JP Office Action dated Feb. 4, 2025 in JP Application No. 2022-577088, with English Translation.
JP Office Action dated Mar. 11, 2025 in JP Application No. 2022-545970, with English Translation.
JP Office Action dated Sep. 30, 2025 in JP Application No. 2022-577088, with English Translation.
KR Office Action dated Dec. 30, 2025 in KR Application No. 10-2023-7001650, with English Translation.
KR Office Action dated Jun. 30, 2025 in KR Application No. 10-2023-7001650, with English Translation.
KR Office Action dated Mar. 11, 2025 in KR Application No. 10-2022-7028703, with English Translation.
KR Office Action dated Nov. 5, 2025 in KR Application No. 10-2022-7028703, with English Translation.
SG Search Report and Written Opinion dated Sep. 16, 2025 in SG Application No. 11202261235T.
TW Office Action and Search Report dated Jul. 22, 2025 in TW Application No. 110121619, with English Translation.
TW Office Action dated Dec. 5, 2025 in TW Application No. 110121619, with English Translation.

* cited by examiner

Legend
(for Figures 17–20)

1760

1762

1764

1806

1706

2006

1906

GAS DISTRIBUTION FACEPLATE WITH OBLIQUE FLOW PATHS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Capacitively coupled plasma (CCP) semiconductor processing tools may be used to perform various semiconductor processing operations, including etching operations. In such tools, process gases may be flowed through a gas distribution faceplate that is part of a showerhead and into a wafer processing area. A wafer to be processed may be supported beneath the gas distribution faceplate such that the process gases flow over the wafer. During processing, a plasma may be generated by applying radio frequency (RF) power to the wafer support or pedestal, which may act as an electrode, that supports the wafer during processing while the gas distribution faceplate or another part of showerhead may act as a second electrode (ground) so as to cause the plasma to come into existence between the wafer and the gas distribution faceplate; the role of anode and cathode may also be reversed in some instances, with the RF power being applied to the gas distribution plate or another part of the showerhead. In some implementations, RF power may be applied to both the wafer support and the gas distribution plate or another part of the showerhead, e.g., both are used as RF electrodes, with the walls of the chamber serving as a ground electrode.

Presented herein are improved gas distribution faceplate structures for use in CCP semiconductor processing tools.

SUMMARY

Details of one or more implementations of the subject matter described in this specification are set forth in the accompanying drawings and the description below. Other features, aspects, and advantages will become apparent from the description, the drawings, and the claims.

The present inventors determined that gas distribution faceplates that are constrained to receive process gases from a plurality of discrete locations, e.g., such as may be provided by a gas distributor mounted adjacent to the gas distribution faceplate, may experience undesirable performance issues if the gas passages through the gas distribution faceplate are kept vertical. For example, one issue that may arise is that in order to deliver the desired amount of process gases to the plasma that is formed above the semiconductor wafer, the diameter of the gas passage at each such discrete location may need to be relatively large—while this may not present an issue initially, such gas distribution faceplates will eventually erode over time during normal processing operations due to the effects of the processing environment, the plasma, and the gas that flows through the gas passages. As a result, the gas passages will slowly increase in size. As the gas passages increase in size, they may become more and more susceptible to hollow-cathode discharge events when the plasma environment is generated. This hollow-cathode discharge may cause arcing that may damage the gas distribution faceplate, the wafer beneath the gas distribution faceplate, and/or any gas distributor plate located adjacent to the gas distribution faceplate.

The present inventors determined that the rate of erosion of the gas passages was directly related to the flow rate of process gases through the gas passages. By clustering multiple gas passages together at each discrete location, e.g., within each area that is provided gas by an adjacent gas distributor plate, the flow rate that was previously flowed through a single gas passage can be subdivided, thereby providing a lower flow rate per passage, which may reduce the erosion experienced by each passage. However, since the gas passages for each discrete location may need to be very closely packed together to fit within the region of each discrete location that receives process gases from the gas distributor plate, the passage outlets on the plasma-facing side may have overlapping wear regions around them that may produce a different type of issue that may affect wafer quality.

In particular, it was found that each gas passage outlet tended to erode in a region of the gas distribution faceplate facing the wafer and encircling the gas passage outlet. Such wear tended to result in a shallow dimple around each such gas passage outlet. In variants featuring closely-spaced gas passage outlets, these wear regions would overlap and the wear effect would be magnified in the overlapping region. This increased wear effect, in turn, may act to "focus" the plasma in the vicinity of the gas passage outlets and thereby cause the plasma to increase in density. This increase in plasma density may, in turn, cause the plasma sheath to bend or distort, which may cause the ions that strike the wafer to no longer travel in primarily the vertical direction. As a result, features that are formed through etching by the plasma-sourced ions may begin to exhibit undesirable levels of "tilt," i.e., no longer be perpendicular to the wafer plane.

To avoid such issues, the present inventors conceived of a gas distribution faceplate that utilizes clusters of gas passages that have inlets that are all clustered around discrete locations on the side of the gas distribution faceplate that would face towards the gas distributor plate, e.g., upwards, but have outlets on the side of the faceplate that is exposed to the plasma environment within the processing chamber that are more widely spaced apart. To accommodate the different inter-inlet and inter-outlet spacings, at least some the gas passages are necessarily angled at an oblique angle (with reference to a vertical axis when the gas distribution faceplate is installed in the semiconductor processing tool in an in-use configuration). The gas passage outlets may be spaced far enough apart that the overlap between wear regions of adjacent gas passage outlets may be reduced or eliminated, thereby avoiding the dimpling effect discussed earlier. At the same time, the use of clusters of gas passages at each discrete location allows the flow rate in each gas passage to be reduced, thereby dramatically reducing erosion of the gas passages and increasing the lifespan of the gas distribution faceplate, in some cases by as much as 400%.

Further details of the above-described concepts are discussed in more detail below with reference to the Figures, although it will be understood that the present disclosure is not limited to only the specific embodiments discussed herein, but also extends to other variants that will be apparent to those of ordinary skill in the art in the context of this disclosure.

At the very least, the following implementations are considered within the scope of this disclosure.

In some implementations, a showerhead is provided that may include a gas distribution faceplate. The gas distribution faceplate may have a first side and a second side opposite the first side and may include a plurality of clusters of gas passages extending from the first side to the second side. Each of the gas passages may exit the second side of the gas distribution faceplate via a corresponding outlet gas port, each outlet gas port may be spaced apart, center-to-center, from the closest neighboring outlet gas port, one or more of the gas passages for each cluster of gas passages may have at least a portion thereof that extends along a direction that is not parallel to a first axis that is perpendicular to an average midplane defined between the first side and the second side, and each cluster of gas passages may have a corresponding set of one or more inlet gas ports. Each gas passage of each cluster of gas passages may exit the first side of the gas distribution faceplate via an inlet gas port of the corresponding set of one or more inlet gas ports for that cluster of gas passages and each inlet gas port of each of the sets of one or more inlet gas ports may be spaced apart, center-to-center, from each inlet gas port of each of the other sets of one or more inlet gas ports.

In some such implementations, each outlet gas port may be spaced apart, center-to-center, from the closest neighboring outlet gas port by at least a first distance when viewed along the first axis, each inlet gas port of each of the sets of one or more inlet gas ports may be spaced apart, center-to-center, from each inlet gas port of each of the other sets of one or more inlet gas ports by at least a second distance when viewed along the first axis, and the first distance may be smaller than the second distance In some implementations, the second side may have a non-planar contour and/or the first side may have a non-planar contour.

In some implementations, the first side may include one or more recesses, each recess having the inlet gas ports for one of the clusters of gas passages.

In some implementations, the gas distribution faceplate may be made from a material comprising one or more materials such as silicon, silicon carbide, quartz, or ceramic.

In some implementations, the material of the gas distribution faceplate may be doped silicon so as to be electrically conductive.

In some implementations, the gas distribution faceplate may be electrically conductive. In other implementations, the gas distribution faceplate may not be electrically conductive.

In some implementations, for each group of gas passages, the diameter of a first circular region that encircles all of the outlet gas ports of that group of gas passages may be larger than the diameter of a second circular region that encircles all of the one or more inlet gas ports of that group of gas passages, the first circular region for that group of gas passages may be the smallest circular region that encircles the outlet gas ports of that group of gas passages, and the second circular region for that group of gas passages may be the smallest circular region that encircles the one or more inlet gas ports of that group of gas passages.

In some implementations, for each group of gas passages, the diameter of the first circular region may be at least twice as large as the diameter of the second circular region.

In some implementations, each gas passage may follow a straight line between the outlet gas port for that gas passage and the inlet gas port for that gas passage.

In some implementations, each gas passage may include a first portion and a second portion, each second portion of each gas passage may be fluidically interposed within the gas distributor faceplate between the outlet gas port for that gas passage and the first portion for that gas passage, each second portion may follow a path that is parallel to the first axis, and each first portion may be at an oblique angle with respect to, or not parallel to, an axis parallel to the first axis.

In some implementations, the gas distribution faceplate may include a non-sacrificial portion that includes the first side and a sacrificial portion that includes the second side and extends up to the non-sacrificial portion, and the second portions may extend through the sacrificial portion.

In some implementations, substantially all of the sacrificial portion may be configured to erode away during a normal operational life span for the gas distribution faceplate during normal operational use.

In some implementations, the second portions may further extend into the non-sacrificial portion and each second portion may fluidically connect with the first portion for the corresponding gas passage within the non-sacrificial portion.

In some implementations, for each pair of gas passages having corresponding outlet gas ports and inlet gas ports, the first distance between the corresponding outlet gas ports for that pair of gas passages may be larger than the center-to-center distance between the corresponding inlet gas ports for that pair of gas passages.

In some implementations, at least some of the inlet gas ports may be connected with multiple gas passages within the gas distribution faceplate.

In some implementations, each inlet gas port may be connected with only a single corresponding one of the gas passages within the gas distribution faceplate.

In some implementations, each set of one or more inlet gas ports may include multiple inlet gas ports arranged in one or more circular arrays.

In some implementations, each set of one or more inlet gas ports may include between 5 and 12 inlet gas ports arranged in one or more circular arrays.

In some implementations, each set of one or more inlet gas ports may at least include between 5 and 6 inlet gas ports arranged in a circular array.

In some implementations, the outlet gas ports may be arranged in a either a triangular or square array and the sets of inlet gas ports are not identically arranged.

In some implementations, the apparatus may further include a gas distributor plate. The gas distributor plate may have a bottom surface that faces towards the first side of the gas distribution faceplate, the gas distributor plate may have a plurality of gas delivery ports located in the bottom surface, and each gas delivery port may overlap with each inlet gas port of the set of one or more inlet gas ports for a corresponding cluster of gas passages when viewed along the first axis.

In some such implementations, the apparatus may further include a semiconductor processing chamber, a wafer support, and a showerhead. The gas distribution faceplate and the gas distributor plate may be part of the showerhead, the showerhead may be positioned above the wafer support, and the wafer support, the gas distribution faceplate, and the gas distributor plate may be located within the semiconductor processing chamber.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

As discussed earlier, the present disclosure is directed at gas distribution faceplates that feature particular arrangements of gas passages that may dramatically extend the lifespan of such gas distribution faceplates by clustering gas passages together into groups, with each group of gas passages having inlet gas ports on an upstream side of the gas distribution faceplate that are tightly grouped, e.g., within the footprint of a gas delivery port of a gas distributor plate, and outlet gas ports on a downstream side of the gas distribution faceplate that are less tightly grouped. Such arrangements, which involve angling some or all of the gas passages in a group of gas passages, allow for the gas passages to support a reduced flow rate (by increasing the number of gas passages) without causing undesirable synergistic erosion between the outlet gas ports of the gas passages in such a group. This, in turn, causes the gas distribution faceplate to have a much longer lifespan than gas distribution faceplates without such arrangements of features. Various implementations of such gas distribution faceplates are discussed below with respect to the Figures, although it will be understood that the scope of this disclosure is not limited to the implementations shown in the Figures.

The gas distribution faceplates discussed herein may be made of any suitable material for use in a semiconductor processing chamber, e.g., silicon, silicon carbide or other ceramic materials, or quartz, although the specific examples discussed herein are contemplated as being made of doped silicon, e.g., silicon that has deliberately had a small amount of a non-silicon material added to it to make it electrically conductive and therefor usable as an electrode. Gas distribution faceplates that use other conductive materials including metals or thin layers of quartz or other various ceramic materials used to protect conductive parts of electrodes may experience localized wear rate issues such as those discussed herein and may also benefit from the techniques and apparatuses discussed herein.

Figure 1:
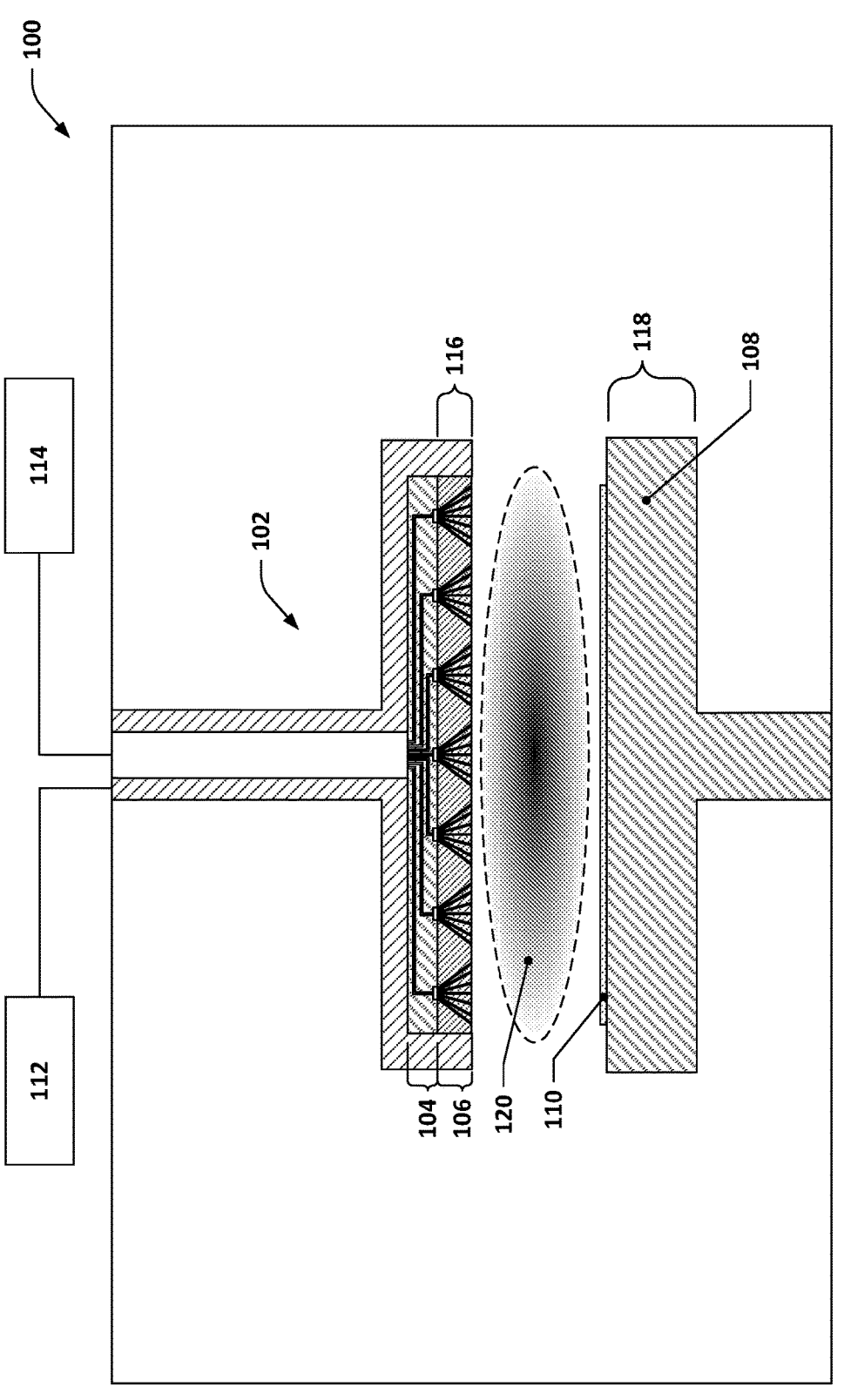
FIG. 1 is a schematic of a semiconductor processing chamber.

FIG. 1 is a schematic of a semiconductor processing chamber. In FIG. 1, a semiconductor processing chamber 100 is shown that includes a showerhead 102 that may include a gas distributor plate (GDP) 104 and a gas distribution faceplate 106. The GDP 104 may be designed to deliver gas provided by one or more gas sources 114 to a plurality of gas delivery ports in the bottom surface of the GDP 104. The gas distribution faceplate 106 may, in turn, have multiple sets of one or more inlet gas ports, with each set of inlet gas ports located on the surface facing the GDP 104 such that the one or more inlet gas ports that are within that set are each overlapped by a corresponding gas delivery port of the GDP 104. Each inlet gas port may, in turn, be fluidically connected with one or more gas passages, with each gas passage fluidically connected with an outlet gas port located on an opposing surface of the gas distribution faceplate 106. The outlet gas ports may be generally evenly distributed across the underside of the gas distribution faceplate 106, which may be electrically connected with radio-frequency (RF) power source 112 and act as an electrode within the semiconductor processing chamber 100. A wafer 110 may be supported within the semiconductor processing chamber 100 by a wafer support 108, which may, in turn, act as a complementary electrode 118. When RF power is applied to the electrode 116 while a process gas is flowed through the gas distribution faceplate, plasma 120 may be caused to be generated in the region above the wafer 110. The plasma 120 may, for example, be used to generate ions that bombard the surface of the wafer 110 and etch features into the top surface of the wafer 110.

A controller (not shown) may be included as well to control various aspects of the process chamber's operation, e.g., controlling when process gas is flowed, controlling when the RF power is applied to the electrode, etc.

While FIG. 1 provides a general overview of a semiconductor processing chamber that uses a gas distribution faceplate as described above, various variants and specific details of such gas distribution faceplates are discussed in more detail with reference to the remaining Figures.

Figures 2, 3, 4:
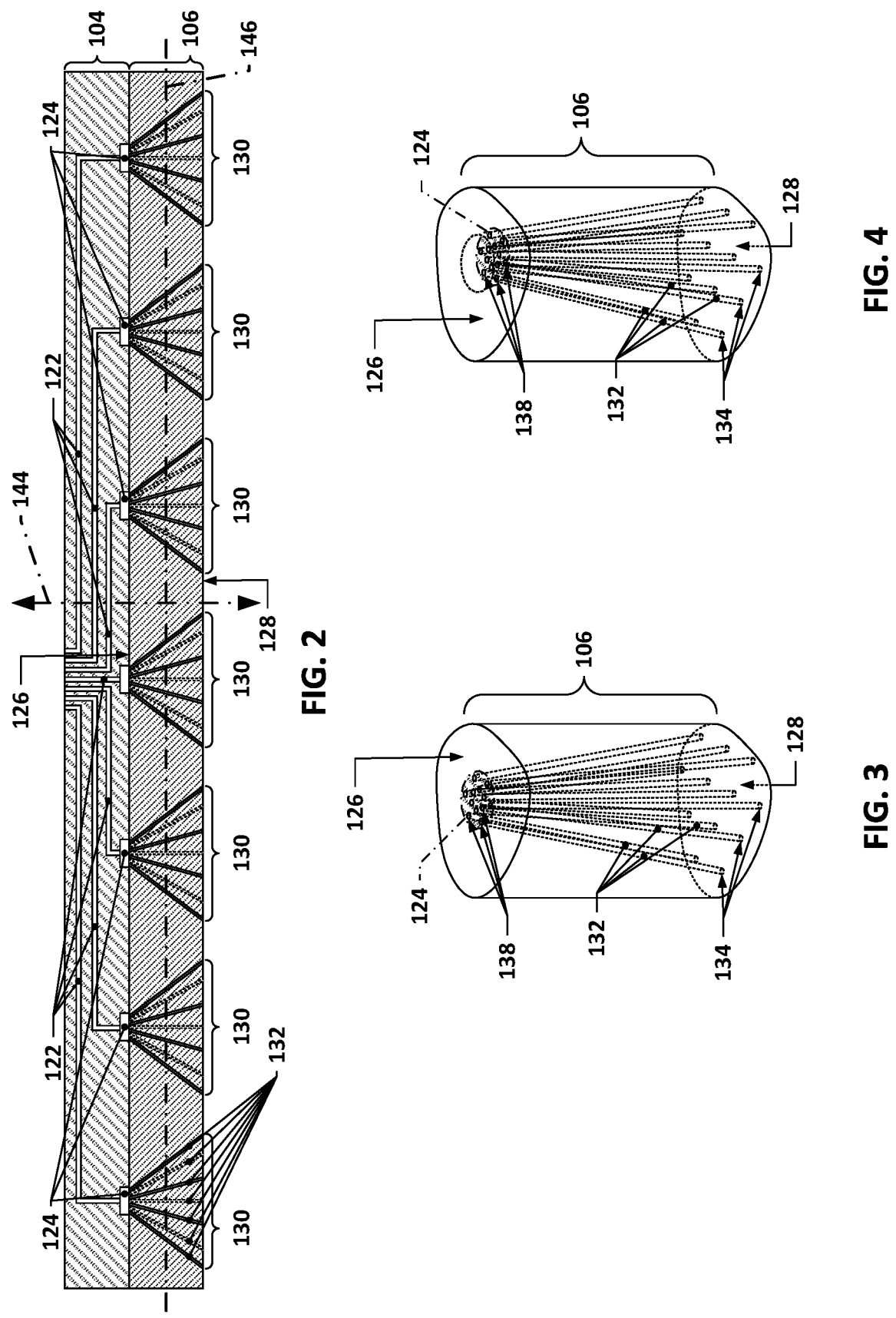
FIG. 2 is a diagram of an example gas distributor plate and a gas distribution faceplate.
FIG. 3 is an isometric view of a portion of an example gas distribution faceplate showing a cluster of gas passages.
FIG. 4 is an isometric view of a portion of an example gas distribution faceplate showing another cluster of gas passages.

FIG. 2 is a diagram of an example gas distributor plate and a gas distribution faceplate. As seen in FIG. 2, a GDP 104 may be provided that includes a plurality of gas delivery ports 124 and a plurality of corresponding gas distribution passages 122 that are arranged to deliver process gas(es) to the gas delivery ports 124 in a desired delivery profile, e.g., at the same flow rates and pressures (or other distribution, as may have been deemed desirable for a given semiconductor process). The GDP 104 may take other forms than what is shown, particularly with respect to the internal structure that is used to deliver process gas(es) to the gas delivery ports 124. The gas distribution faceplates 106 discussed herein may be used regardless of such differences in structure of the GDP 104.

As can be seen, the gas distribution faceplate 106 has a first side 126 and a second side 128. An average midplane 146 may be defined between the first side 126 and the second side 128 (the average midplane 146 will be understood to be a plane that is midway between two reference planes, each reference plane defined by either the first side 126 or the second side 128; each reference plane, for example, may either be one of the sides itself, if planar, or a plane defined by a point cloud of points representing the side (if the side is non-planar)). The average midplane 146 may, in turn, be orthogonal to a first axis 144, which is typically aligned with the vertical axis in most semiconductor processing chambers. The first side 126 may generally be coincident, or nearly coincident, with the interface between the gas distribution faceplate 106 and the GDP 104, although this is not necessarily the case for all gas distribution faceplates 106. In many implementations, a thin layer of thermal interface material, such as a thermally and electrically conductive gasket material, may be placed adjacent to the first side 126 (or most of the first side) to provide a seal between the GDP 104 and the gas distribution faceplate 106 as well as to enhance thermal and electrical conductivity in the interface between the GDP 104 and the gas distribution faceplate 106.

In some gas distribution faceplates 106, for example, there may be localized areas of the first side 126 that are spaced apart from the GDP 104, as will be discussed later herein. In such implementations, the first side 126 will be understood to be inclusive of such localized areas as well as the surrounding regions of the first side 126 that are coincident, or nearly coincident (such as would occur if a thermal interface material layer is interposed between the GDP 104 and the first side 126), with the GDP 104.

The gas distribution faceplate 106 also includes multiple clusters 130 of gas passages 132; other gas passages 132 are shown but not separately called out. The gas passages 132 may extend from the first side 126 to the second side 128 and, in this example, are straight holes that extend along a linear path between the inlet gas ports and the outlet gas ports located on the first side 126 and the second side 128, respectively. Generally speaking, nearly all or all of the gas passages 132 in each cluster 130 may extend along paths that are at least partially at oblique angles to the first axis 144 (or to axes that are parallel to the first axis 144), i.e., are not parallel to the first axis 144. This allows the outlet gas ports on the second side 128 for each cluster to be spaced apart from one another to a much greater extent than the inlet gas ports on the first side 126.

FIG. 3 is an isometric view of a portion of an example gas distribution faceplate, such as that shown in FIG. 2, showing a cluster of gas passages. As can be seen in FIG. 3, there is a set of inlet gas ports 138 clustered within an area on the first side 126 that is within the footprint of a gas delivery port 124 (the cross-hatched circular area represents the boundary of a gas delivery port 124 on the GDP 104; this area does not necessarily need to be circular, however). As can be further seen, each gas passage 132 is fluidically connected with an outlet gas port 134 located on the second side 128. In this example, the center of the group of inlet gas ports 138 is centered over the group of outlet gas ports 134.

The depicted implementation features twelve gas passages 132 that are connected with inlet gas ports 138 that are arranged in two concentric circular arrays of six inlet gas ports 138, although it will be understood that other implementations may feature greater or lesser numbers of gas passages 132 and/or inlet gas ports 138. For example, some implementations may feature three gas passages, four gas passages, five gas passages, six gas passages, seven gas passages, eight gas passages, nine gas passages, ten gas passages, eleven gas passages, thirteen gas passages, and so forth. In some cases, there may be as few as two gas passages in a cluster, although this may provide insufficient prolongation of the lifespan of the gas distribution faceplate 106. It will also be understood that while the gas distribution faceplates shown in the Figures all show only clusters of multiple gas passages, some implementations of gas distribution faceplates may feature, in addition to clusters having a particular number of multiple gas passages, a) one or more clusters having a different number of gas passages and/or b) one or more instances in which only one gas passage is provided for fluidic connection with a gas delivery port (instead of a cluster of multiple gas passages). For example, if a gas distribution faceplate having one gas passage per gas delivery port of the GDP experiences outlet gas port erosion that varies as a function of radial distance from the center axis of the gas distribution faceplate, e.g., outlet gas port erosion at the periphery of the gas distribution faceplate that is at a first rate (which may be generally ideal in terms of attaining the desired lifespan of the gas distribution faceplate), outlet gas port erosion at the mid-diameter of the gas distribution faceplate that is at a second rate that is twice the first rate, and outlet gas port erosion at the center of the gas distribution faceplate that is at a third rate that is twice the second rate, then the gas passages near the periphery of such a gas distribution faceplate may be left unmodified, i.e., each gas delivery port of the GDP near the periphery of the gas distribution faceplate may have only a single gas passage that is fluidically connected therewith within the gas distribution faceplate/GDP interface, but the gas passages located at the mid-diameter and the center of the gas distribution faceplate may be replaced with clusters of gas passages. For example, the gas passages for gas delivery ports located near the mid-diameter of the gas distribution plate may each be replaced with clusters of two gas passages, i.e., each gas delivery port in the GDP near the mid-diameter of the gas distribution faceplate may be fluidically connected with a cluster of two gas passages, and the gas passages for gas delivery ports near the center of the gas distribution faceplate may each be replaced with a cluster of four gas passages, i.e., each gas delivery port in the GDP near the center of the gas distribution faceplate may be fluidically connected with a cluster of four gas passages. It will be understood that other configurations of gas distribution faceplates are within the scope of this disclosure as well. It will be further understood that in implementations that feature instances of single gas passages that are each configured to fluidically connect with a single gas delivery port, such gas passages may either be parallel to the center axis of the gas distribution faceplate or, as with instances of clustered gas passages, at an oblique angle to the center axis of the gas distribution faceplate.

The gas passages may, for example, be drilled holes that are between about 0.010" and 0.1" in diameter, inclusive, e.g., 0.010", 0.020", 0.030", 0.040", 0.050", 0.060", 0.070", 0.080", 0.090", and 0.100", as well as diameters within ±0.005" of each of those values. In some implementations, the gas passages 132 of a gas distribution faceplate 106 may all be the same diameter, although in other implementations, the gas passages 132 may have varying diameters, e.g., to allow for fine tuning of the flow resistance of each gas passage 132. In some implementations, one or more of the gas passages 132 may have varying dimensions along the length thereof, e.g., a gas passage 132 may have a first diameter at the inlet gas port 138 and a second, smaller diameter at a location located within the gas distribution faceplate 106. This may allow for further tuning of the gas flow characteristics of each gas passage 132. Such features may be used to counteract the effects of flow resistance differences between gas passages 132 that may result from differences in length between the gas passages 132.

The gas distribution faceplates 106 discussed herein may be relatively thick, e.g., on the order of one or two inches thick in some instances or locations, permitting the outlet gas ports 134 for the gas passages 132 in some implementations to achieve the desired degree of spacing on the second side 128 with only relatively minor tilting of the gas passages 132 from vertical, e.g., ~±10° from vertical. Any suitable technique may be used to produce the gas passages 132, including using mechanical drilling techniques, laser drilling techniques, electrical discharge drilling techniques, water jet drilling techniques, and so forth.

FIG. 4 is an isometric view of a portion of an example gas distribution faceplate showing another cluster of gas passages 132. The depicted configuration is identical to that shown in FIG. 3, except that the center of the group of inlet gas ports 138 is not centered over the group of outlet gas ports 134—while this may result in some asymmetries in the lengths of the gas passages 132 for such a cluster, such a configuration may allow the positioning of each cluster of inlet gas ports 138 to be tailored to adapt to the locations of gas delivery ports 124 on a GDP 104 that do not necessarily align with the centers of the groups of outlet gas ports 134 to which the gas passages 132 that are provided gas by the gas delivery ports 124 are connected.

Figure 5:
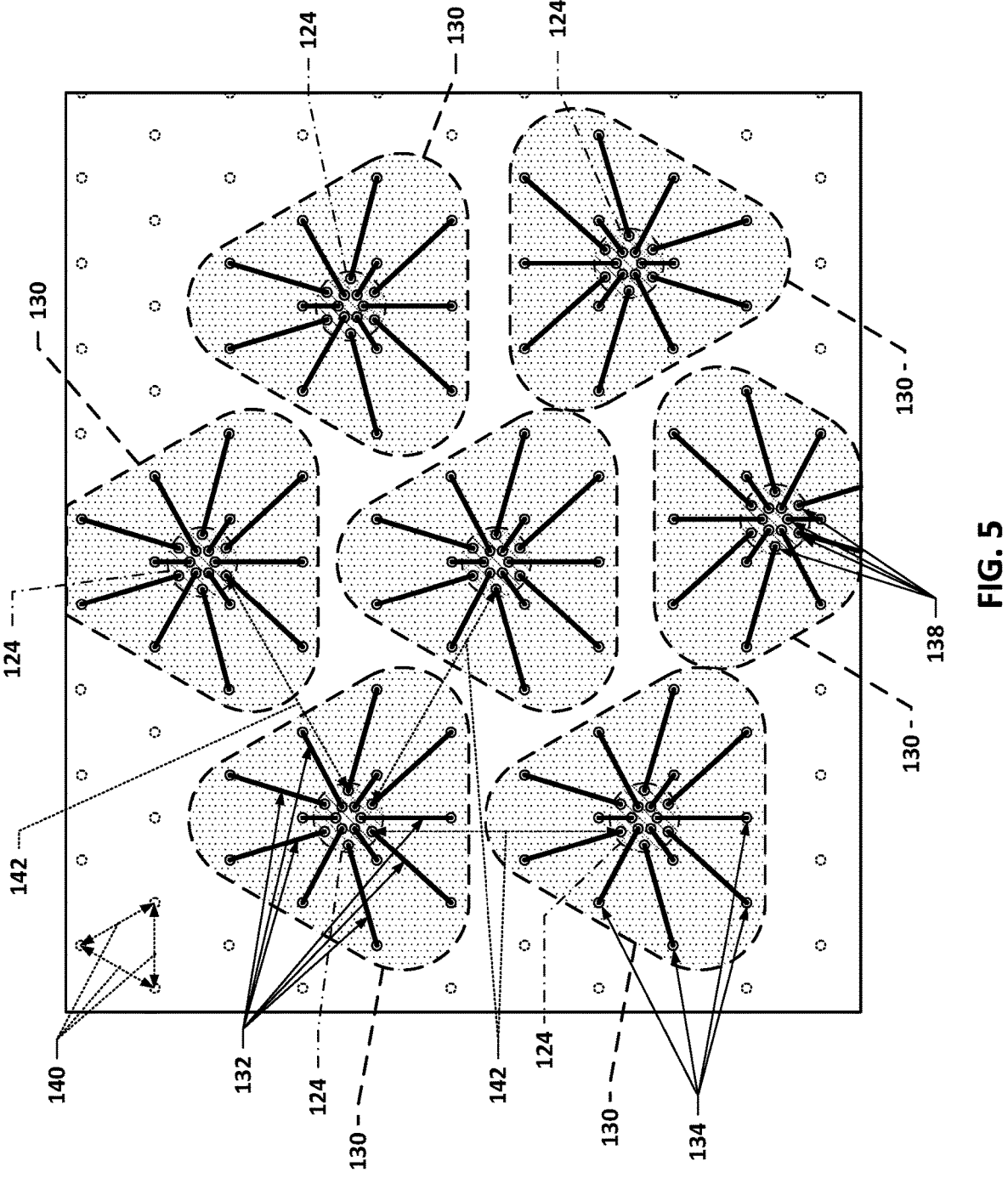
FIG. 5 is a plan view of a portion of another example gas distribution faceplate.
Figure 6:
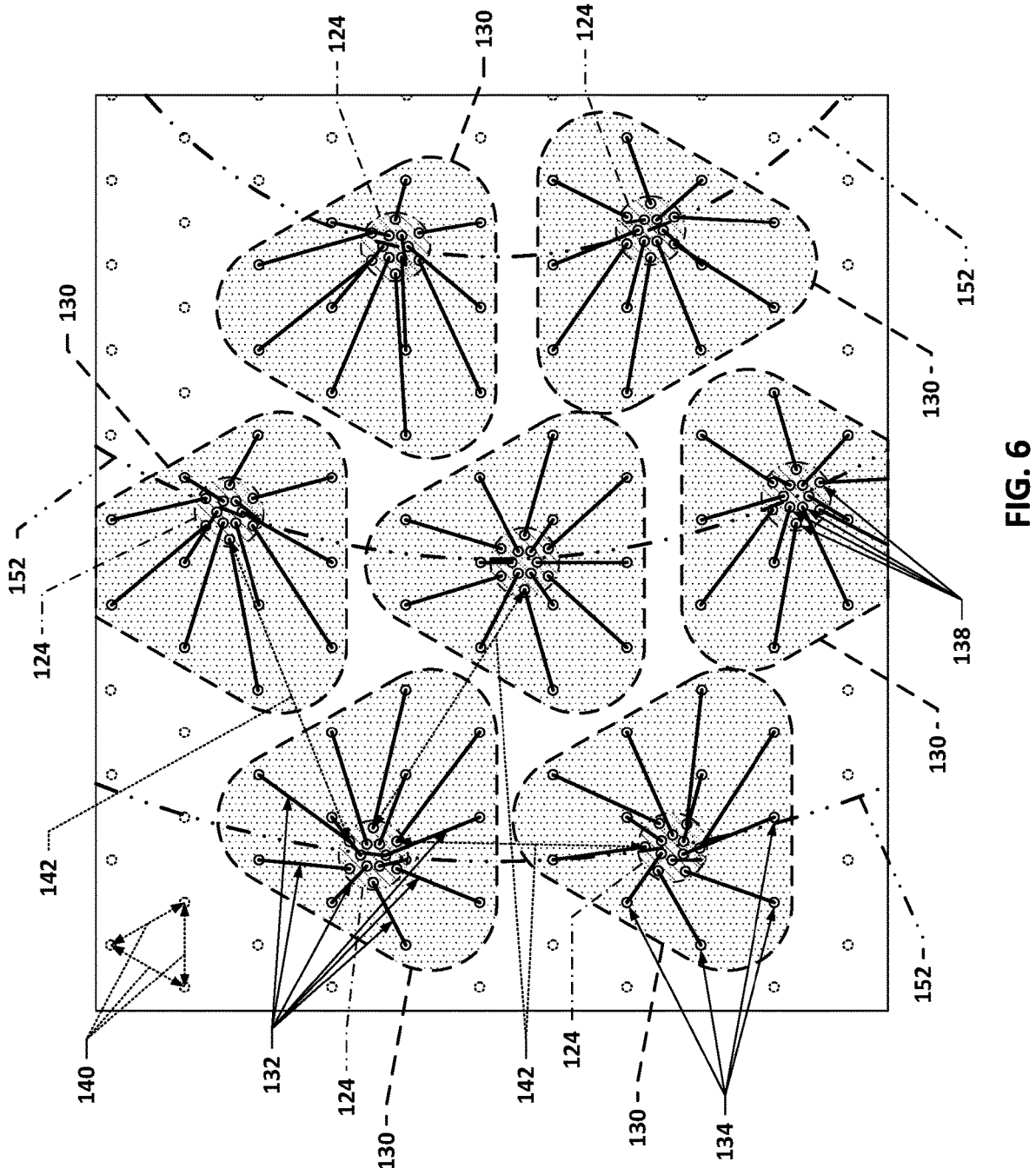
FIG. 6 is a plan view of a portion of an example gas distribution faceplate.

This may be more clearly observed with reference to FIGS. 5 and 6. FIG. 5 is a plan view of a portion of another example gas distribution faceplate. As can be seen in FIG. 5, the gas distribution faceplate 106 may have a plurality of outlet gas ports 134 that may be arranged in a space-filling array, e.g., a triangular array, in which outlet gas ports 134 are spaced apart from neighboring outlet gas ports 134 with a center-to-center spacing of at least a first distance 140; it will be understood that the outlet gas ports 134 may also be arranged in other configurations, e.g., a square array or some other arrangement that has been determined to produce desirable gas distribution characteristics, including arrangements in which the outlet gas ports are not equidistantly spaced from the neighboring outlet gas ports. For example, in some implementations, the outlet gas ports for each cluster of gas passages may be arranged in a circular pattern centered on the gas delivery port for the GDP associated with that cluster, resulting in different spacing between neighboring outlet gas ports, e.g., for a given outlet gas port, the two outlet gas ports in the same circular pattern on either side of the given outlet gas port may be equidistantly spaced therefrom, but the spacing between the given outlet gas port and the closest outlet gas port of a neighboring circular pattern of outlet gas ports may be different from the equidistant spacing distance.

In this example, several clusters 130 (each enclosed within a broken-line, shaded triangular boundary) of gas passages 132 (represented by heavy-weight lines extending between inlet gas ports 138 and outlet gas ports 134) are shown, with each cluster 130 including twelve outlet gas ports 134, twelve inlet gas ports 138, and twelve gas passages 132. The inlet gas ports 138 for each cluster 130 are each shown within a circular cross-hatched region that corresponds with the location of one of the gas delivery ports 124 of a GDP 104. In this example implementation, each gas delivery port 124 is generally centered within each group of twelve outlet gas ports 134, and the twelve gas passages 132 for each cluster 130 are thus generally only of three different lengths. For example, for each group of twelve outlet gas ports 134, there are three outlet gas ports 134 that are arranged in a first circular array around the center of the gas delivery port 124 (and have gas passages 132 of a first length), a further three outlet gas ports 134 that are arranged in a second circular array around the center of the gas delivery port 124 (and have gas passages 132 of a second length longer than the first length), and six remaining outlet gas ports 134 that are arranged along a third circle centered on the center of the gas delivery port 124 (and that have gas passages of a third length longer than the second length).

FIG. 6 is a plan view of a portion of an example gas distribution faceplate and has many of the same features as discussed above with respect to FIG. 5. However, the gas delivery ports 124 in FIG. 6 are located according to a plurality of hole patterns 152, e.g., in this example, circular arrays of gas delivery ports 124, that result in the gas delivery ports 124 not being located in positions that are aligned with the centers of the groups of outlet gas ports 134. As a result, the lengths and angles that the gas passages 132 may have may differ for each gas passage 132 within a given cluster 130. These differences in length may, in some instances, have a negligible effect on gas delivery uniformity for a given process, but in other implementations, the gas passages 132 may be engineered, as discussed above, to have different geometries that cause the flow resistance of each gas passage to be generally the same.

It will be understood that the gas distribution faceplate 106 shown in FIGS. 5 and 6 includes additional outlet gas ports 134, e.g., near the periphery of the depicted portion, that would also be part of respective clusters 130 and be connected with respective gas passages 132 and inlet gas ports 138 but which are, to reduce drawing clutter, not separately indicated with callouts (or shown as connected to gas passages 132). Moreover, the triangular regions and circular regions associated with the clusters 130 and the gas delivery ports 124 for the peripheral regions are not shown or called out.

It will be further noted that the first distances 140 between outlet gas ports 134 in a cluster 130 may be much larger than the distances between the inlet gas ports 138 in the same cluster. For example, the inlet gas ports 138 for a cluster 130 may, in some implementations, all lie within a first circular area, e.g., the smallest circular region that touches the outermost inlet gas ports 138 for that cluster 130, and the outlet gas ports 134 for that cluster may all lie within a second circular area, e.g., the smallest circular region that touches the outermost outlet gas ports 134 of that cluster 130; the second circular area may have a diameter, for example, that is larger than the first circular area. In some implementations, the second circular area may have a diameter that is at least 2, 3, 4, or 5 times (up to ±0.1, 0.2, 0.3, 0.4, or 0.5) as large as the diameter of the first circular area. In some implementations, the first circular area may, for example, have a diameter that is within ±0.05" of 0.1", 0.2", 0.3", 0.4", 0.5", 0.6", 0.7", 0.8", 0.9", or 1". In other implementations, the first circular area may have a diameter larger than 1".

The first distances 140 may, for example, be selected so as to reduce or eliminate the overlap of localized wear regions that may develop around each outlet gas port 134. For example, if each wear region has a nominal outer perimeter of approximately X in, then the outlet gas ports 134 may be spaced apart by at least X in. It will be understood that the size of the wear regions around the outlet gas ports 134 may vary depending on process conditions, and the first distances 140 may thus correspondingly depend on the particular wear effects that result from a given semiconductor process. In some implementations, for example, the first distance 140 may be within ±0.1 mm, ±0.2 mm, ±0.3 mm, ±0.4 mm, or ±0.5 mm of at least 2 mm, 3 mm, 4 mm, 5 mm, 6 mm, 7 mm, 8 mm, 9 mm, 10 mm, 11 mm, 12 mm, 13 mm, 14 mm, 15 mm, 16, mm, 17 mm, 18 mm, 19 mm, or 20 mm.

In the above examples, the gas passages 132 are simple, straight holes that are formed at various angles. While such implementations may be suitable for some semiconductor processes, an alternate implementation may provide for enhanced longevity for a gas distribution faceplate. Such an alternate implementation is shown in FIG. 7, which is a diagram of another example gas distributor plate and a gas distribution faceplate.

Figures 7, 8, 9:
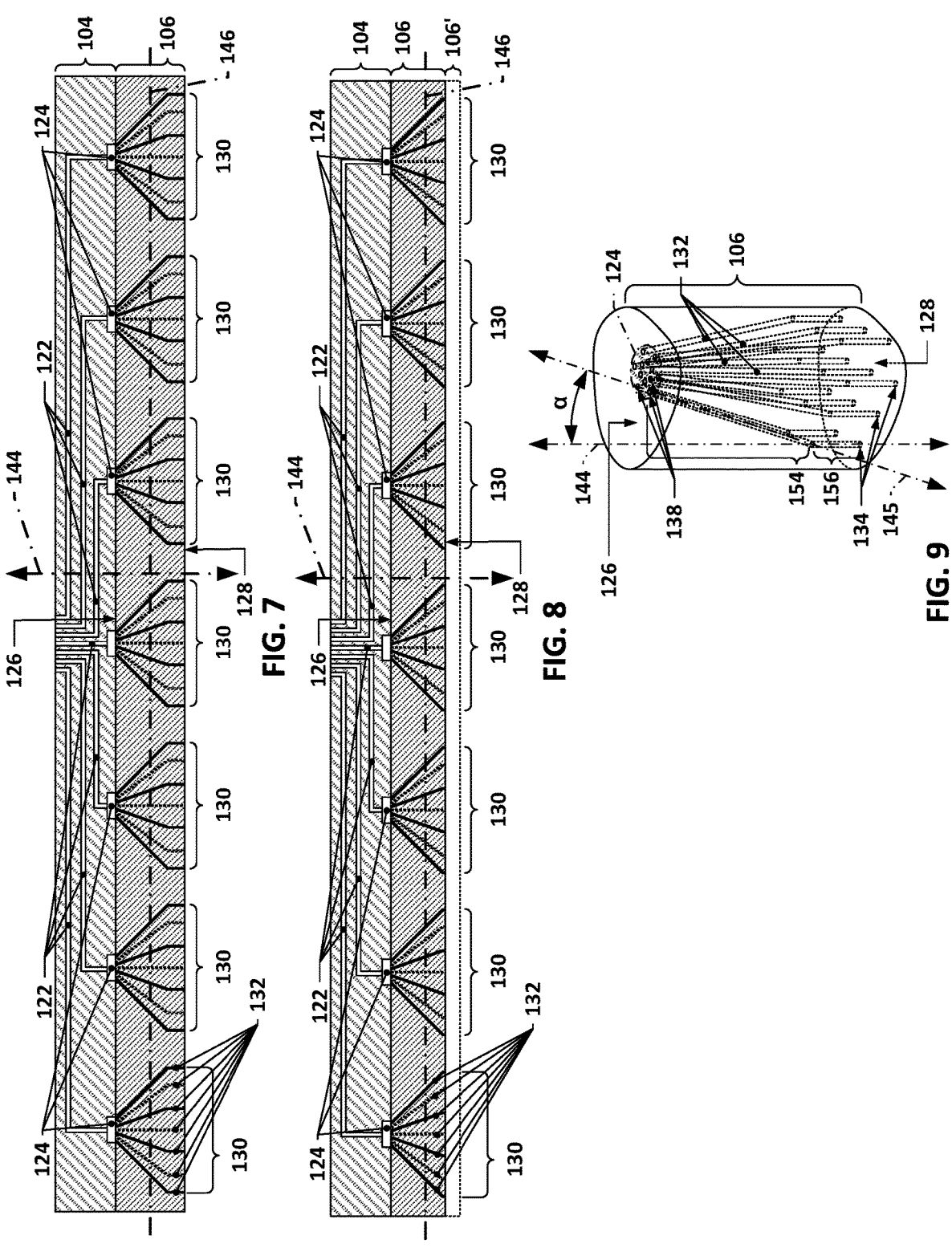
FIG. 7 is a diagram of another example gas distributor plate and a gas distribution faceplate.
FIG. 8 is a diagram of the example gas distributor plate and a gas distribution faceplate of FIG. 7 after the gas distribution faceplate has been partially eroded.
FIG. 9 is an isometric view of a portion of an example gas distribution faceplate showing another cluster of gas passages with non-linear flow paths.

FIG. 7 depicts a GDP 104 and a gas distribution faceplate 106 that are identical to those shown in FIG. 2 except that the gas passages 132 that are shown do not each follow a single linear path between their respective inlet gas port 138 and outlet gas port 134. FIG. 9 shows a detail view of a portion of a gas distribution faceplate 106 with such gas passages 132. As can be seen, each gas passage 132 includes two portions—a first portion 154 that follows a path along a first direction 145 that is at an oblique angle α with respect to the first axis 144 (or with respect to an axis parallel to the first axis 144) and a second portion 156 that is parallel to the first axis 144 (it is noted that in FIG. 7, the middle gas passage 132 of each cluster 130 is shown as straight, although it is to be understood that this is simply due to the viewpoint of the Figure). The first portion 154 and the second portion 156 of each gas passage 132 may be fluidically connected with one another, e.g., the first portion 154 may be drilled from the first side 126 of the gas distribution faceplate 106, and the second portion 156 may be drilled from the second side 128 of the gas distribution faceplate 106 such that it joins up with the first portion 154.

The second portion 156 may have a length that is longer than the anticipated erosion depth of the second side 128 of the gas distribution faceplate 106 during a desired operational lifetime. For example, a gas distribution faceplate 106 may have a non-sacrificial portion, e.g., closer to the GDP 104 and including the first side 126, and a sacrificial portion, e.g., on the underside of the gas distribution faceplate 106, including the second side 128, and extending up to the non-sacrificial portion. The sacrificial portion of the gas distribution faceplate 106 is designed to provide material that will, during normal operational use, erode away such that all or nearly all of the sacrificial portion will have been removed by the end of the normal operational lifetime of the gas distribution faceplate but all or nearly all of the non-sacrificial portion of the gas distribution faceplate will remain. It will be understood that the sacrificial portion and the non-sacrificial portion may refer to different portions of a single, contiguous structure, and do not necessarily refer to two discrete parts.

For example, if it is anticipated that a gas distribution faceplate 106 will experience approximately 2 mm of erosion during the lifetime of the component (and that the sacrificial portion is thus approximately 2 mm thick), then the lengths of the second portions may be set to at least that value or to a value higher than 2 mm, e.g., 2.5 mm. Thus, when the gas distribution faceplate 106 erodes over time, e.g., as shown in FIG. 8 (the eroded gas distribution faceplate 106 is shown, with a dotted outline showing the sacrificial portion 106' of the gas distribution faceplate 106 that has been eroded away), the first distances 140 (see FIG. 6 or 5) between the outlet gas ports 134 may remain unchanged for the lifetime of the gas distribution faceplate 106. In contrast, an implementation such as that shown in FIG. 2 would, as the second side 128 thereof erodes, see the center-to-center distance between adjacent outlet gas ports 134 change over time due to the erosion, e.g., the first distance 140 would shrink, and the distance between outlet gas ports 134 of different clusters 130 would increase. The variant of FIG. 7 may thus be used if such changes in distance would result in undesirable variation in process uniformity for the wafers processed using such a gas distribution faceplate 106.

In some implementations, the length of the second portions 156 may be at least double the thickness of the sacrificial portion, i.e., the anticipated erosion depth of the second side 128, of the gas distribution faceplate 106. For example, if it is anticipated, as discussed above, that a gas distribution faceplate 106 will experience approximately 2 mm of erosion during the lifetime of the component, then the lengths of the second portions may be set to at least that value or to a value higher than 4 mm, e.g., 4.5 mm. Such arrangements may provide extra depth for the second portions 156 such that near the end of the operational lifetime of the gas distribution faceplate 106, there is sufficient depth to the second portions 156 after the sacrificial portion has been removed or largely removed that erosion within the second portions 156 that remain is managed in a manner that avoids undesirable changes in the performance of the gas distribution faceplate 106.

The above discussions relating to the characteristics of the second portions will be understood to be applicable to a variety of anticipated erosion scenarios, including, for example, erosion scenarios in which the second side 128 of a gas distribution faceplate 106 has a sacrificial portion with a thickness within ±0.1 mm, ±0.2 mm, ±0.3 mm, ±0.4 mm, or ±0.5 mm of 1 mm, 2 mm, 3 mm, 4 mm, 5 mm, 6 mm, 7 mm, 8 mm, 9 mm, or 10 mm. In other implementations, a gas distribution faceplate may have non-linear gas passages in which the first and second portions are reversed, i.e., the portions of the gas passages that follow a path that is parallel to the center axis of the gas distribution faceplate may be fluidically interposed between the first side of the gas distribution faceplate and the portions of those gas passages that are at an oblique angle to the center axis of the gas distribution faceplate.

Figure 10:
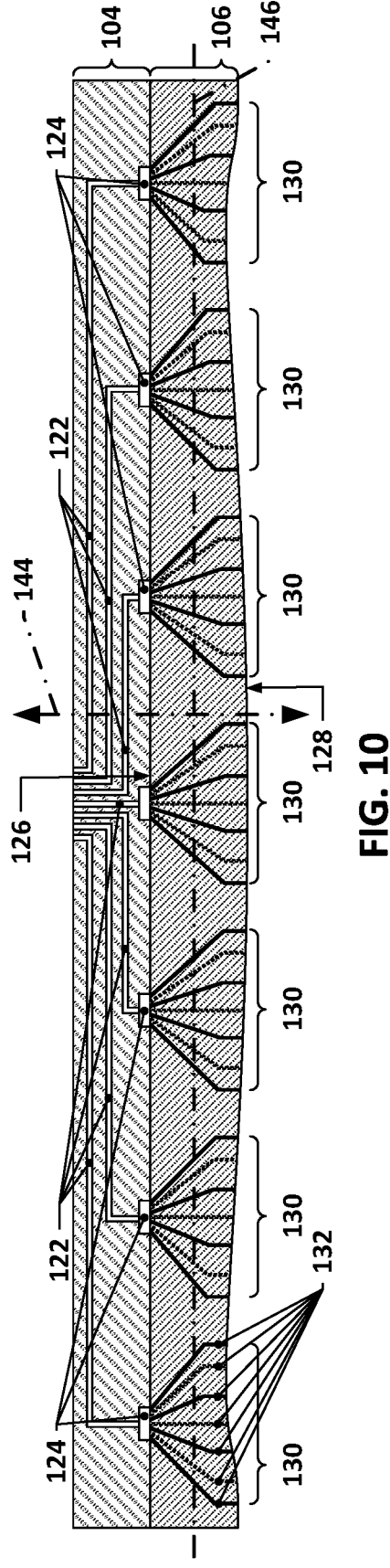
FIG. 10 is a diagram of another example gas distributor plate and a gas distribution faceplate.

It will be appreciated that the gas distribution faceplates 106 discussed herein may feature second sides 128 that may be either planar, as shown in implementations discussed above, or non-planar, e.g., contoured, as shown in FIG. 10, which is a diagram of another example gas distributor plate and a gas distribution faceplate.

The elements of FIG. 10 are similar to those of FIGS. 2 and 7, and the earlier discussions thereof are applicable to the corresponding elements of FIG. 10 as well. As can be seen in FIG. 10, the underside, i.e., the second side 128, of the gas distribution faceplate 106 has a contoured surface, and similar clusters of gas passages 132 may be used in a similar manner even with contoured gas distribution faceplates. In the depicted version, non-linear gas passages 132 are used (similar to those in FIG. 7), although linear gas passages 132 may alternatively be used. In some implementations where the non-linear gas passages 132 are used, the lengths of the second portions 156 may be designed to be the same, as shown, or may instead be designed to all be drilled to the same depth relative to the first side 126 of the gas distribution faceplate 106 (in which case the minimum depth of the second portions 156 relative to the second side 128 may be set to a value that is greater than the expected amount of erosion for that gas distribution faceplate 106 during its lifetime).

Figure 12:
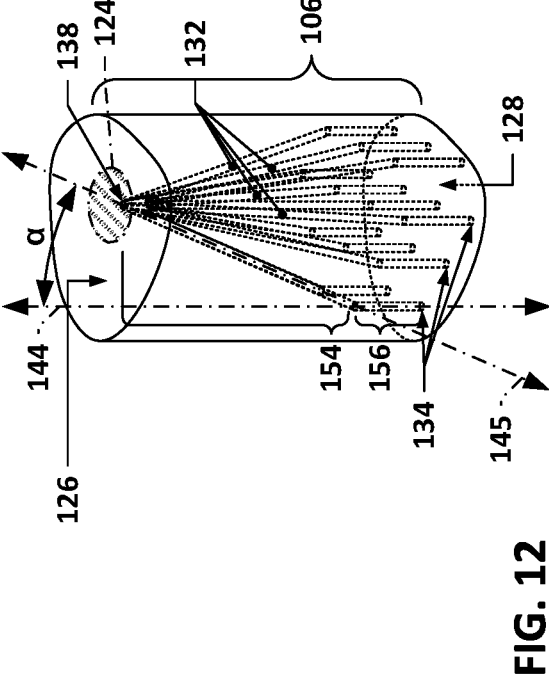
FIG. 12 is an isometric view of a portion of an example gas distribution faceplate showing a cluster of gas passages with non-linear flow paths.
Figure 11:
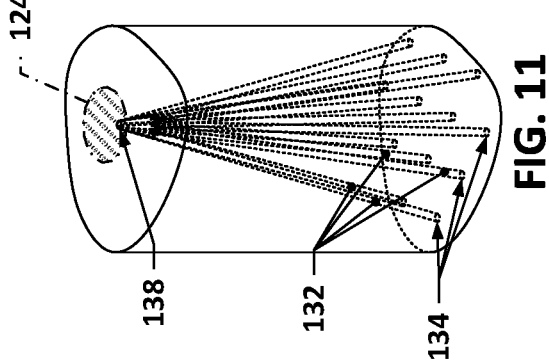
FIG. 11 is an isometric view of a portion of an example gas distribution faceplate showing another cluster of gas passages.

In some implementations, two or more of the gas passages 132 for a cluster 130 of gas passages 132 may share a common inlet gas port 138, i.e., the set of one or more inlet gas ports for a given cluster may be only a single inlet gas port, as shown in FIGS. 11 and 12, which both show isometric views of a portion of an example gas distribution faceplate showing a cluster of gas passages. In FIG. 11, the gas passages 132 are all straight gas passages, and in FIG. 12, the gas passages 132 are all two-part gas passages 132 featuring a first portion 154 and a second portion 156. In both cases, all of the gas passages 132 share a single common inlet gas port 138. It will be noted that the inlet gas port 138, in this case, is located in a position relative to the gas delivery port 124 that is off-center from the circular area representing the gas delivery port 124. Generally speaking, it may be preferable to locate the inlet gas ports 138 on the gas distribution faceplate 106 such that the inlet gas ports 138 are not located directly beneath the location where process gas is introduced into the gas delivery port 124. Such an offset between the gas delivery port 124 and the inlet gas port 138 may also be used in instances in which there is only a single inlet gas port 138 receiving gas from a particular gas delivery port 124. In this example, the gas delivery ports 124 have gas introduced into them at the center of each circular area, and the inlet gas ports 138 are therefore offset from the centers of the circular areas representing the gas delivery ports 124. This same positioning paradigm may also be used in the implementations discussed earlier, e.g., implementations where each gas passage 132 has a separate inlet gas port 138. Such offset hole placement may reduce the chance of plasma arc event occurring in the gas delivery port 124 area.

It will be understood that in other implementations, there may be a plurality of inlet gas ports 138 for a given cluster of gas passages 132, but multiple gas passages 132 may still terminate at a common inlet gas port 138 for that cluster 130. For example, there may be twelve gas passages 132 and only four inlet gas ports 138 for a given cluster 130, and each inlet gas port 138 may be fluidically connected with three gas passages 132 within the gas distribution faceplate 106.

As discussed earlier, the first side of a gas distribution faceplate may have localized regions where the first side is offset from the GDP by some distance. Various examples of such faceplates are discussed below with reference to FIGS. 13 through 16. For convenience, the various features shown in FIGS. 13 through 16 use callouts having the same last two numbers as are used in earlier Figures to refer to generally corresponding structures, and it will be understood that such earlier discussion of such similar features is equally applicable to the corresponding structures in FIGS. 13 through 16 unless indicated otherwise in the discussion below.

It will also be understood that while the examples shown in FIGS. 13 through 16 all feature non-linear gas passages, i.e., gas passages that have a first portion that is at an oblique angle to an axis parallel to the center axis and a second portion that is parallel to the center axis, other similar faceplates in which the gas passages are linear, e.g., as shown in FIG. 2, are also within the scope of this disclosure. It will also be appreciated that while FIGS. 13 through 16 are provided for the purposes of discussing gas distribution faceplates having localized regions where the first side is offset from the GDP by some distance, similar gas distribution faceplates may also be provided that do not have such localized regions.

Figures 13, 14:
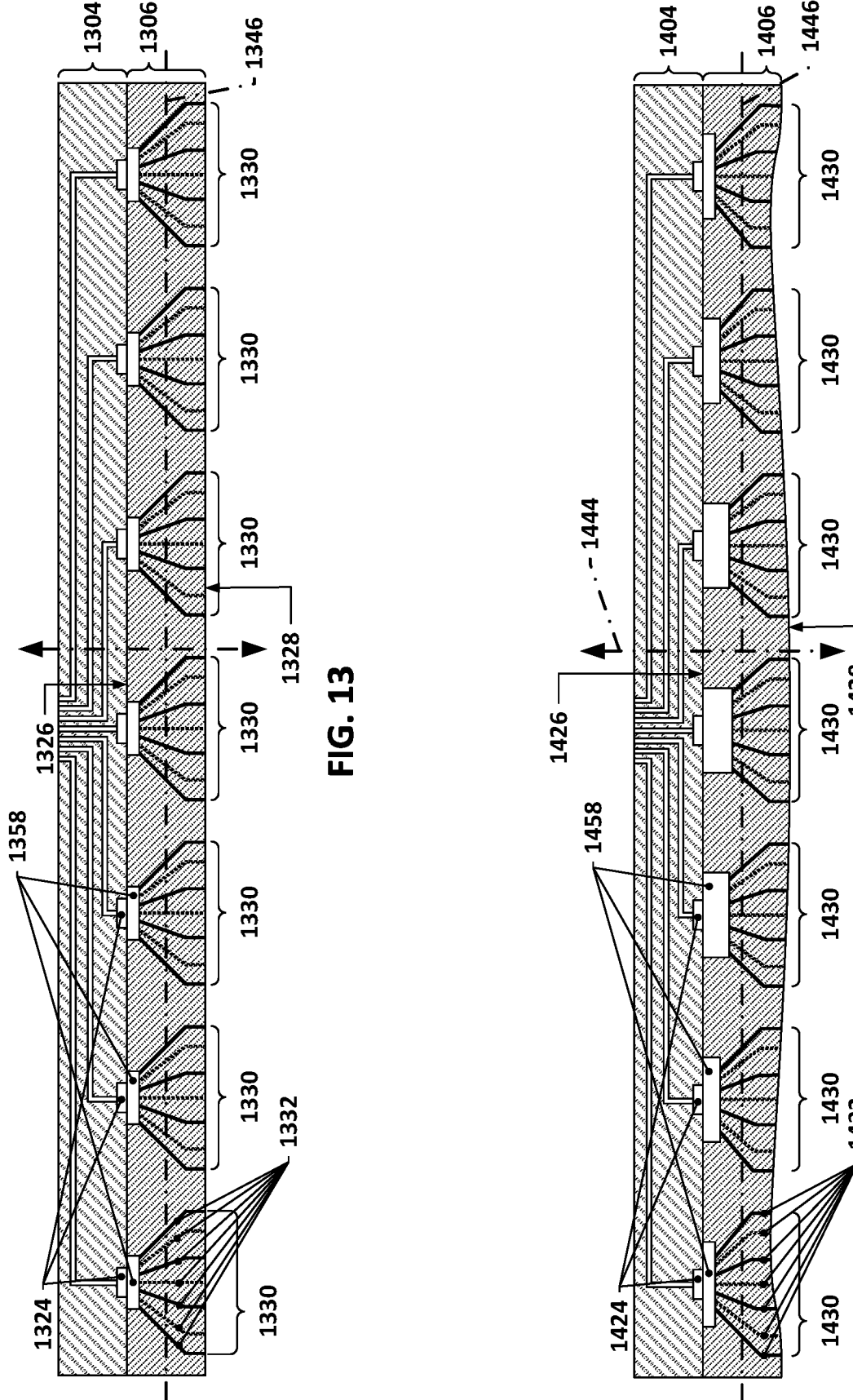
FIG. 13 is a diagram of a gas distribution faceplate with recesses in the first side.
FIG. 14 is a diagram of a gas distribution faceplate with recesses in the first side and a contoured second side.

FIG. 13 is a diagram of a gas distribution faceplate with recesses in the first side. As can be seen, the first side 1326 of the gas distribution faceplate 1306 features a plurality of recesses 1358, each recess 1358 aligning with one of the gas delivery ports 1324. The recesses may, for example, have the same footprint (cross-sectional shape and size when viewed along the center axis of the gas distribution faceplate) as the gas delivery ports 1324 or may, as depicted, have larger footprints; the recesses, for example, may be cylindrical bores, although other shapes are possible as well. This, in effect, acts to extend the gas delivery ports 1324 into the gas distribution faceplate 106. If the recesses 1358 are larger in diameter than the case delivery ports 1324 with which they each interface, this may provide a larger area in which to place inlet gas ports for the gas passages 1332 for each gas delivery port 1324.

FIG. 14 is a diagram of a gas distribution faceplate with recesses in the first side and a contoured second side. In this example, the recesses 1458 have different depths such that the lengths of the gas passages 1432 may remain more tightly clustered, regardless of the thickness of the gas distribution faceplate 1406. For example, the recess 1458 at the center of the gas distribution faceplate 1406 is deeper than the recesses 1458 at the edges of the gas distribution faceplate 1406 since the thickness of the gas distribution faceplate 1406 is thicker in the center of the gas distribution faceplate 1406 compared with near the edges. This helps reduce the variation in the lengths of the gas passages 1432 in each cluster 1430, making the gas passage lengths more uniform, which may decrease the variance in gas flow between the gas passages 1432 and make the gas distribution through the gas distribution faceplate 1406 more uniform.

Figures 15, 16:
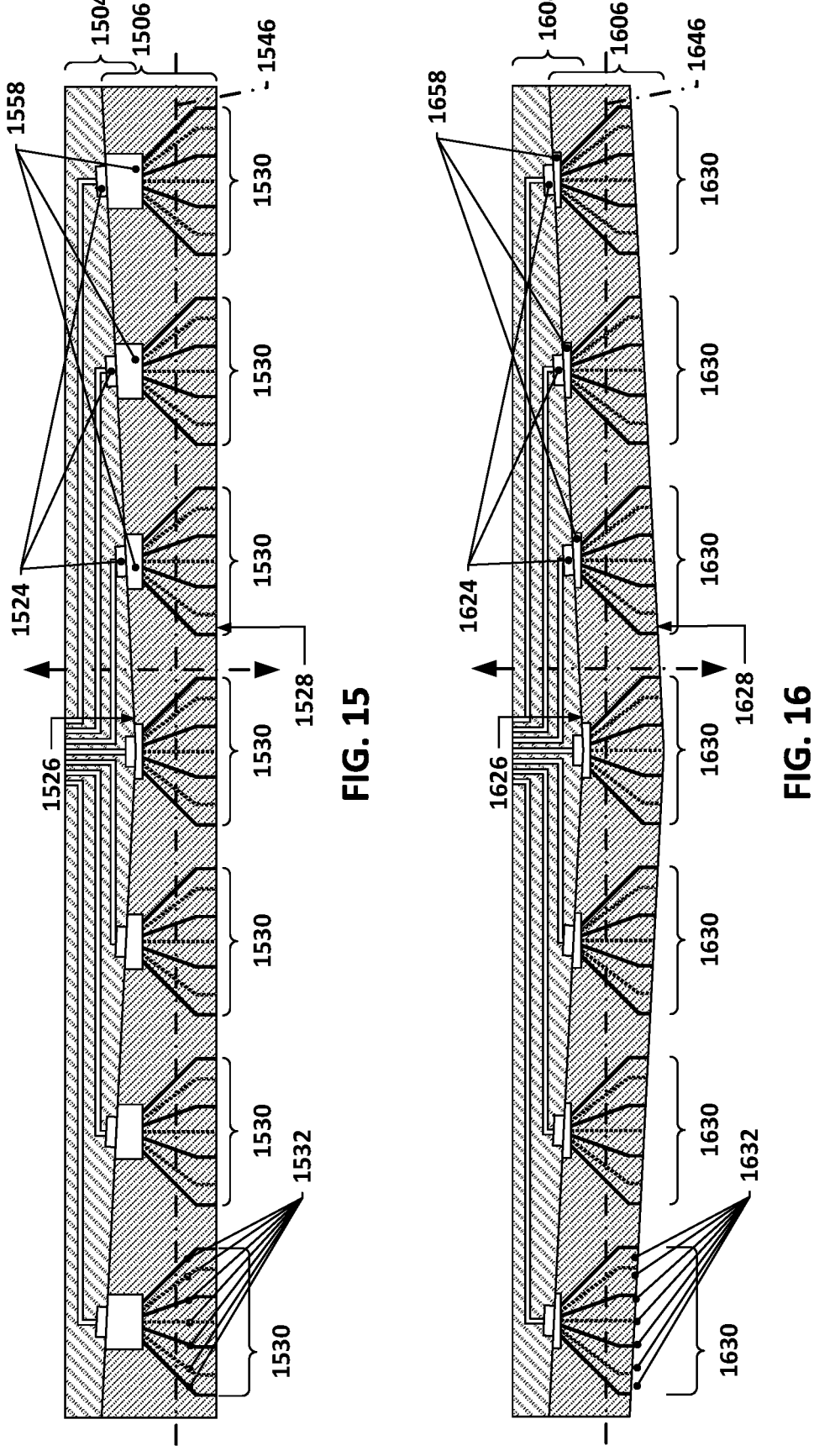
FIG. 15 is a diagram of a gas distribution faceplate with recesses in a contoured first side.
FIG. 16 is a diagram of a gas distribution faceplate with recesses in a contoured first side; the gas distribution faceplate also has a contoured second side.

FIG. 15 is a diagram of a gas distribution faceplate with recesses in a contoured first side. In FIG. 15, the GDP 1504 has, in contrast to GDPs discussed earlier, a non-planar surface facing towards the gas distribution faceplate 1506. The first side 1526 of the gas distribution faceplate 1506 may have a complementary contour. In this example, the recesses 1558 have varying depths such that the gas passages 1532 in each cluster 1530 may be of generally the same length (or at least do not have lengths that are affected by the contouring of the first side 1526.

FIG. 16 is a diagram of a gas distribution faceplate with recesses in a contoured first side; the gas distribution faceplate also has a contoured second side. In this example, the first side 1626 and the second side 1628 are both contoured (in this case, in an identical manner, although other implementations may feature different contours on the first side 1626 and the second side 1628). The recesses 1658 may be identical in depth (to attain a larger area in which the inlet gas ports may be located, as discussed above with respect to FIG. 13) or may, for example, be of varying depths, e.g., to accommodate a varying-thickness gas distribution faceplate 1606.

It will be understood that gas distribution faceplates incorporating the angled gas passages discussed herein may, in some circumstances, include both such angled gas passages as well as vertical passages (passages that extend along an axis that is parallel to the first axis discussed earlier). For example, if a given gas distribution faceplate sees dramatically increased erosion around the outlet gas ports of the gas passages that are located near the outer perimeter of the gas distribution faceplate as opposed to near the center of the gas distribution faceplate, the gas passages within an interior region of the gas distribution faceplate may be vertical (when installed in the semiconductor processing chamber in which it is to be used) or parallel to the first axis, whereas the gas passages within an exterior region of the gas distribution faceplate may be provided using clusters of angledly angled gas passages. Several examples of such faceplates are discussed below.

Figures 17, 18, 19, 20:
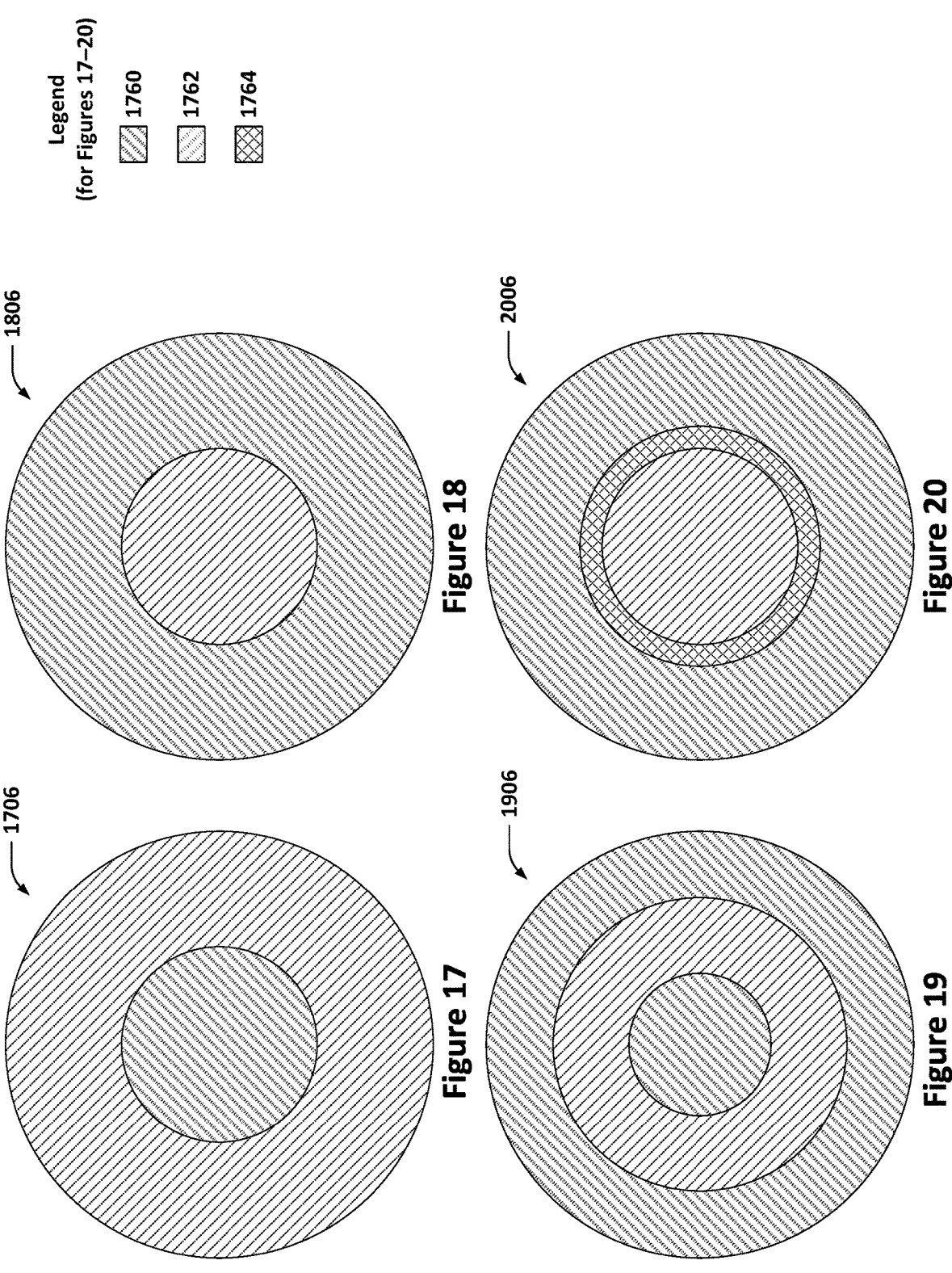
FIG. 17 is a diagram of an example gas distribution faceplate showing different regions that may have angled or non-angled gas passages.
FIG. 18 is a diagram of another example gas distribution faceplate showing different regions that may have angled or non-angled gas passages.
FIG. 19 is a diagram of yet another example gas distribution faceplate showing different regions that may have angled or non-angled gas passages.
FIG. 20 is a diagram of a further example gas distribution faceplate showing different regions that may have angled or non-angled gas passages.

FIG. 17 is a diagram of an example gas distribution faceplate showing different regions that may have angled or non-angled gas passages. In FIG. 17, an angled passage region 1760 is centrally located on a gas distribution faceplate 1706 and has a non-angled passage region 1762 that encircles it. The gas passages that are in the angled passage region 1760 may, for example, be provided by clusters of gas passages that are at an oblique angle to the first axis (which may be understood, in the case of this and the Figures discussed in the following paragraphs, to extend in a direction perpendicular to the plane of the page on which the Figures are located), such as are discussed earlier with at least respect to FIGS. 3 through 6. The gas passages that are in the non-angled passage region 1762 may, for example, be clusters of non-angled gas passages, i.e., gas passages that extend along their entire length along axes that are perpendicular to the page of the Figure. In some implementations, some or all the gas passages in the non-angled passage region 1762 may not be arranged in clusters, i.e., a single non-angled passage may be provided at each location that corresponds with the location of a different one of some or all of the gas delivery ports of a gas distribution plate that may be configured to provide processing gases to the gas distribution faceplate within the non-angled passage region 1762.

FIG. 18 is a diagram of another example gas distribution faceplate showing different regions that may have angled or non-angled gas passages. The implementation of FIG. 18 is the same as that of FIG. 17 except that the angled passage region 1760 and the non-angled passage region 1762 are switched in location (with the angled passage region 1760 encircling the non-angled passage region 1762).

FIG. 19 is a diagram of yet another example gas distribution faceplate showing different regions that may have angled or non-angled gas passages. In FIG. 19, there are three separate regions—an annular angled passage region 1760, a circular angled passage region 1760, and an annular non-angled passage region 1762 radially interposed between them. It will be understood that the inverse arrangement of regions may also be implemented in some cases, e.g., with the center-most region being a non-angled passage region 1762 and with the regions alternating in type as one moves radially outward from the center. It will also be understood that there may be more than one, two or three regions of angled and/or non-angled passages in some gas distribution faceplates, e.g., there may be four, five, six, etc. alternating regions of angled and/or non-angled passages in some gas distribution faceplates (there may also be some gas distribution faceplates that do not have any non-angled gas passages except, potentially, for a centrally located non-angled gas passage.

FIG. 20 is a diagram of a further example gas distribution faceplate showing different regions that may have angled or non-angled gas passages. FIG. 20 is similar to FIG. 18 except that a third mixed angled/non-angled passage region 1764 is shown in between the non-angled passage region 1762 and the angled passage region 1760. The mixed angled/non-angled passage region 1762 may include both angled passages, as discussed above, and non-angled passages, as also discussed above.

It will be appreciated that implementations such as the above implementations that include both angled passage regions and non-angled passage regions may be used when particular regions of a gas distribution faceplate may experience higher flow rates, and thus increased erosion rates, than other regions of the gas distribution faceplate. In such instances, clusters of angled passages may be used in regions that may see higher flow rates and erosion to reduce the erosion effects, while non-angled passages may be used in the regions that do not exhibit such increased erosion effects. In doing so, the production cost of the gas distribution faceplate may be reduced while still increasing the potential lifetime of the gas distribution faceplate. For example, angled passages will generally require more material removal than non-angled passages (due to the slope of the passages), which increase the machining time needed to manufacture angled passages as compared with non-angled passages. For angled passages, it may also be the case that the tool head that machines the passages may need to be repositioned in not only in terms of X, Y, and Z location (as would generally be the case for a non-angled passage), but also rotated about one, two, or three axes in order to ensure that the passage is machined so as to extend along the correct angular direction. Such tool positioning may also require additional machining time that is not required for non-angled passages. By using non-angled passages in regions where angled passages would provide a reduced benefit in terms of reducing the erosion rate, the extra costs of machining angled passages in those areas may be avoided while still using the angled passages in the areas where enhanced erosion control may be desired. It will also be understood that the regions of angled and non-angled passages discussed above may also represent regions in which angled passages are provided that may differ in characteristic from one another. For example, there may be a region in which clusters of angled passages are provided that have 4 angled passages per cluster and in which the gas passages may extend along axes that are 30° from the first axis and another region in which there may be six angled passages per cluster and in which the gas passages may extend along axes that are 40° from the first axis. The present disclosure is directed towards such implementations, as well as other foreseeable variants thereof.

It will be understood that in some implementations of gas distribution faceplates such as are discussed herein, the presence of clusters of angled gas passages within the gas distribution faceplate may be inferred based on the hole spacings evident from viewing the exterior of the gas distribution faceplate. For example, each inlet or outlet gas port on either the first side or the second side of a gas distribution faceplate may be associated with a "closest neighbor distance" that is the center-to-center distance between that inlet or outlet gas port and the closest inlet or outlet gas port, respectively, thereto. In gas distribution faceplates that feature angled and non-angled passage regions, and in which the non-angled passage regions are also arranged in clusters of multiple such non-angled passages such that each cluster is located at a position that corresponds with a gas delivery port of a gas distribution plate, the average of the closest neighbor distance for the outlet gas ports for the angled passages may be higher than the average of the closest neighbor distance for the outlet gas ports for the non-angled passages. In other words, the outlet gas ports for the angled passages may be more spread out or more evenly distributed within the angled passage regions than the outlet gas ports for the non-angled passages are in the non-angled passage regions. For example, in some implementations the average of the closest neighbor distance for the outlet gas ports for the angled passages may be 20% or more, 30% or more, 40% or more, 50% or more, 60% or more, 70% or more, 80% or more, 90% or more, or 100% or more higher than the average of the closest neighbor distance for the outlet gas ports for the non-angled passages.

In some implementations, angled and non-angled gas passage regions may be differentiated from one another using the ratio of the average of the closest neighbor distance for the outlet gas ports to the average of the closest neighbor distance for the inlet gas ports within each such region. For example, the ratio of the average of the closest neighbor distance for the outlet gas ports to the average of the closest neighbor distance for the inlet gas ports within a non-angled passage region will be 1:1 since the locations of the inlet gas ports and the outlet gas ports within such a region will be identical. In contrast, the ratio of the average of the closest neighbor distance for the outlet gas ports to the average of the closest neighbor distance for the inlet gas ports within an angled passage region will be greater than 1:1, e.g., in some implementations, greater than or equal to 1.5:1, greater than or equal to 2:1, greater than or equal to 2.5:1, greater than or equal to 3:1, greater than or equal to 3.5:1, greater than or equal to 4:1, greater than or equal to 4.5:1, or greater than or equal to 5:1.

It will also be understood that, generally speaking, for clusters of angled gas passages, the ratio of the average of the closest neighbor distances for the outlet gas ports within each cluster of angled gas passages, evaluated for each outlet gas port within that cluster with respect to the other outlet gas ports within that cluster of angled gas passages, to the average of the closest neighbor distance for the inlet gas ports within that same cluster of angled gas passages, evaluated for each inlet gas port within that cluster of angled gas passages with respect to the other inlet gas ports of that cluster of angled gas passages, will be greater than 1:1, e.g., in some implementations, greater than or equal to 1.5:1, greater than or equal to 2:1, greater than or equal to 2.5:1, greater than or equal to 3:1, greater than or equal to 3.5:1, greater than or equal to 4:1, greater than or equal to 4.5:1, or greater than or equal to 5:1.

In the discussion above, it will be understood that the average closest neighbor distance for a given population of ports may be determined by determining, for each port in the population of ports, what the corresponding closest neighbor distance is for that port, summing that closest neighbor distances for all of the ports in the population, and then dividing by the number of ports in the population. If a given port has two or more "closest neighbors," i.e., the closest ports to that port are both or all the same distance away from the given port, then the closest neighbor distance may be selected to be the distance from that port to any arbitrary one of the closest neighbor ports.

In some implementations, a controller may be provided. The controller may be part of a system that may include the above-described examples, and may be operatively connected with various valves, mass flow controllers, pumps, etc. so as to be able to receive information from and/or control such equipment. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of various gases, such as through the faceplates as described herein, temperature settings (e.g., heating and/or cooling), pressure settings, vacuum settings, power settings, flow rate settings, fluid delivery settings, and positional and operation settings.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. A showerhead comprising:
   a gas distribution faceplate, wherein:
   the gas distribution faceplate has a first side and a second side opposite the first side,
   the gas distribution faceplate includes a plurality of clusters of gas passages,
   each of the gas passages exits the first side of the gas distribution faceplate via a corresponding inlet gas port in the first side of the gas distribution faceplate and exits the second side of the gas distribution faceplate via a corresponding outlet gas port in the second side of the gas distribution faceplate,
   each outlet gas port is spaced apart, center-to-center, from the closest neighboring outlet gas port,
   one or more of the gas passages for each cluster of gas passages has at least a portion thereof that extends along a direction that is not parallel to a first axis that is perpendicular to an average midplane defined between the first side and the second side,
   the inlet gas ports within each cluster of gas passages are arranged in one or more circular arrays,
   the inlet gas ports for each cluster of gas passages are grouped around a respective center and the respective centers are distributed in a spaced-apart manner across the first side of the gas distribution faceplate,
   at least one of the one or more circular arrays in each cluster of gas passages includes at least three of the gas passages, and
   each inlet gas port of each cluster of gas passages is spaced apart, center-to-center, from each inlet gas port of each of the other clusters of gas passages.

2. The showerhead of claim 1, wherein:
   each outlet gas port is spaced apart, center-to-center, from the closest neighboring outlet gas port by at least a first distance, each inlet gas port of each cluster of gas passages is spaced apart, center-to-center, from each inlet gas port of each of the other clusters of gas passages by at least a second distance, and the first distance is smaller than the second distance.

3. The showerhead of claim 1, wherein, for at least a first cluster of the clusters of gas passages:

each outlet gas port of the first cluster is spaced apart, center-to-center, from the closest neighboring outlet gas port of the first cluster by a corresponding first closest neighbor distance, each inlet gas port of gas passages in the first cluster is spaced apart, center-to-center, from the closest neighboring inlet gas port of the first cluster by a corresponding second closest neighbor distance, the ratio of the average of the first closest neighbor distances for the outlet gas ports of the first cluster to the average of the second closest neighbor distances for the inlet gas ports of the gas passages in the first cluster is greater than 1:1.

4. The showerhead of claim 1, wherein the second side has a non-planar contour.

5. The showerhead of claim 1, wherein the first side has a non-planar contour.

6. The showerhead of claim 1, wherein the first side includes one or more recesses, each recess having the inlet gas ports for a different one of the clusters of gas passages located therewithin.

7. The showerhead of claim 1, wherein the gas distribution faceplate is made from a material comprising one or more materials selected from the group consisting of: silicon, silicon carbide, ceramics, and quartz.

8. The showerhead of claim 7, wherein the material of the gas distribution faceplate is doped silicon so as to be electrically conductive.

9. The showerhead of claim 1, wherein the gas distribution faceplate is electrically conductive.

10. The showerhead of claim 1, wherein, for each cluster of gas passages:

the diameter of a first circular region that encircles all of the outlet gas ports of that cluster of gas passages is larger than the diameter of a second circular region that encircles all of the inlet gas ports of that cluster of gas passages, the first circular region for that cluster of gas passages is the smallest circular region that encircles the outlet gas ports of that cluster of gas passages, and the second circular region for that cluster of gas passages is the smallest circular region that encircles the inlet gas ports of that cluster of gas passages.

11. The showerhead of claim 10, wherein, for each cluster of gas passages, the diameter of the first circular region is at least twice as large as the diameter of the second circular region.

12. The showerhead of claim 1, wherein each gas passage follows a straight line between the outlet gas port for that gas passage and the inlet gas port for that gas passage.

13. The showerhead of claim 1, wherein:

each gas passage includes a first portion and a second portion, each second portion of each gas passage is fluidically interposed within the gas distribution faceplate between the outlet gas port for that gas passage and the first portion for that gas passage, each second portion follows a path that is parallel to the first axis, and each first portion is not parallel to the first axis.

14. The showerhead of claim 13, wherein:

the gas distribution faceplate includes a non-sacrificial portion that includes the first side and a sacrificial portion that includes the second side and extends up to the non-sacrificial portion, and the second portions extend through the sacrificial portion.

15. The showerhead of claim 14, wherein substantially all of the sacrificial portion is configured to erode away during a normal operational life span for the gas distribution faceplate during normal operational use.

16. The showerhead of claim 14, wherein:

the second portions further extend into the non-sacrificial portion, and each second portion fluidically connects with the first portion for the corresponding gas passage within the non-sacrificial portion.

17. The showerhead of claim 1, wherein, for each pair of gas passages having corresponding outlet gas ports and inlet gas ports, the first a distance between the corresponding outlet gas ports for that pair of gas passages is larger than a center-to-center distance between the corresponding inlet gas ports for that pair of gas passages.

18. The showerhead of claim 1, wherein at least some of the inlet gas ports are connected with multiple gas passages within the gas distribution faceplate.

19. The showerhead of claim 1, wherein each inlet gas port is connected with only a single corresponding one of the gas passages within the gas distribution faceplate.

20. The showerhead of claim 1, wherein the inlet gas ports within each cluster of gas passages are arranged in multiple concentric circular arrays.

21. The showerhead of claim 1, wherein there are between 5 and 12 inlet gas ports within each cluster of gas passages.

22. The showerhead of claim 1, wherein there are between 5 and 6 inlet gas ports within each cluster of gas passages.

23. The showerhead of claim 1, wherein the outlet gas ports are arranged in a triangular or square array and inlet gas ports are not identically arranged.

24. The showerhead of claim 1, further comprising a gas distributor plate, wherein:

the gas distributor plate has a bottom surface that faces towards the first side of the gas distribution faceplate, the gas distributor plate has a plurality of gas delivery ports located in the bottom surface, and each gas delivery port overlaps with each inlet gas port of a corresponding one of the clusters of gas passages when viewed along the first axis.

\* \* \* \* \*